United States Patent [19]
Tokami

[11] Patent Number: 5,592,423
[45] Date of Patent: Jan. 7, 1997

[54] SEMICONDUCTOR INTEGRATED CIRCUIT ENABLING EXTERNAL MONITOR AND CONTROL OF VOLTAGE GENERATED IN INTERNAL POWER SUPPLY CIRCUIT

[75] Inventor: Kenji Tokami, Hyogo, Japan

[73] Assignee: Mitsubishi Denki Kabushiki Kaisha, Tokyo, Japan

[21] Appl. No.: 485,918

[22] Filed: Jun. 6, 1995

[30] Foreign Application Priority Data

Oct. 4, 1994 [JP] Japan .................................. 6-240126

[51] Int. Cl.⁶ ...................................................... G11C 7/00
[52] U.S. Cl. .......................... 365/221; 365/203; 365/205; 365/226; 365/189.09
[58] Field of Search .................................... 365/203, 205, 365/189.09, 159.11, 201, 226

[56] References Cited

U.S. PATENT DOCUMENTS

| | | | |
|---|---|---|---|
| 5,450,362 | 9/1995 | Matsuzaki | 365/189.09 |
| 5,463,585 | 10/1995 | Sanada | 365/226 |
| 5,471,429 | 11/1995 | Lee et al. | 365/201 |

FOREIGN PATENT DOCUMENTS

| | | |
|---|---|---|
| 3-160699 | 7/1991 | Japan . |
| 4-114393 | 4/1992 | Japan . |
| 5-2883 | 1/1993 | Japan . |

*Primary Examiner*—Joseph E. Clawson, Jr.
*Attorney, Agent, or Firm*—Lowe, Price, LeBlanc & Becker

[57] ABSTRACT

In this semiconductor integrated circuit device, an internal power supply circuit and an external terminal are connected to each other via a switch circuit having an n channel MOS transistor and a p channel MOS transistor connected in series. While a control signal is input to a gate of the n channel MOS transistor constituting the switch circuit, a control signal inverted by an inverter is input to a gate of the p channel MOS transistor. Thus, both transistors are simultaneously turned on/off by those control signals. When an output voltage of the internal power supply circuit is monitored from the external terminal or when an internal circuit of a semiconductor integrated circuit is driven by a voltage applied to the external terminal, even if a potential of the external terminal overshoots to positive or negative values, the transmission of the potential to the internal circuit is cut off by the n channel MOS transistor or p channel MOS transistor. Therefore, in testing of monitoring of an operating state of the semiconductor integrated circuit and testing of an operating margin for an internal power supply voltage, no adverse influence is exerted on the internal circuit.

10 Claims, 15 Drawing Sheets

FIG. 10

| A0 | A1 | A2 | A3 | A4~A8 | S1 | S2 | S3 | S4 | S5 | S6 | TE1 | $\overline{TE2}$ | TE3 | TE4 | CONTENTS OF TEST MODE |
|---|---|---|---|---|---|---|---|---|---|---|---|---|---|---|---|
| 0 | 0 | 0 | 0 | ARBITRARY | 1 | 0 | 0 | 0 | 1 | 0 | 0 | 1 | 0 | 0 | int.Vcc MONITOR |
| 1 | 0 | 0 | 0 | ARBITRARY | 1 | 0 | 0 | 0 | 1 | 0 | 0 | 0 | 0 | 0 | int.Vcc APPLICATION |
| 0 | 1 | 0 | 0 | ARBITRARY | 0 | 0 | 0 | 0 | 1 | 1 | 0 | 1 | 0 | 0 | VREF MONITOR/ APPLICATION |
| 1 | 1 | 0 | 0 | ARBITRARY | 0 | 1 | 0 | 0 | 1 | 0 | 0 | 1 | 0 | 0 | Vcp MONITOR |
| 0 | 0 | 1 | 0 | ARBITRARY | 0 | 1 | 0 | 0 | 1 | 0 | 0 | 1 | 0 | 1 | Vcp APPLICATION |
| 1 | 0 | 1 | 0 | ARBITRARY | 0 | 0 | 1 | 0 | 1 | 0 | 0 | 1 | 0 | 0 | VBL MONITOR |
| 0 | 1 | 1 | 0 | ARBITRARY | 0 | 0 | 1 | 0 | 1 | 0 | 0 | 1 | 1 | 0 | VBL APPLICATION |
| 1 | 1 | 1 | 0 | ARBITRARY | 0 | 0 | 0 | 1 | 1 | 0 | 0 | 1 | 0 | 0 | VBB MONITOR |
| 0 | 0 | 0 | 1 | ARBITRARY | 0 | 0 | 0 | 1 | 1 | 0 | 1 | 1 | 0 | 0 | VBB APPLICATION |

SEMICONDUCTOR INTEGRATED CIRCUIT ENABLING EXTERNAL MONITOR AND CONTROL OF VOLTAGE GENERATED IN INTERNAL POWER SUPPLY CIRCUIT

BACKGROUND OF THE INVENTION

1. Field of the Invention

The present invention relates generally to semiconductor integrated circuit devices and, more particularly, to a semiconductor memory device having an internal power supply circuit such as a dynamic random access memory (hereinafter referred to as a DRAM).

2. Description of the Background Art

As the result of scaling down a gate length of an MOS transistor in accordance with a larger scale integration of a semiconductor memory device such as a DRAM, it is effective to lower an operating supply voltage in order to achieve reliability of transistors and also decrease power consumption thereof. However, a conventional voltage of 5 V must be applied as an external voltage level of semiconductor memory devices in order to maintain compatibility with transistor logic (hereinafter referred to as TTL).

Thus, a method is adopted in general in which an internal voltage down converter for lowering an external power supply voltage ext. $V_{CC}$ from 5 V to approximately 3 V to 4 V to apply the lowered voltage to an internal circuit is formed in a chip, so as to satisfy a higher reliability, a faster operation and a lower power consumption.

Further, despite an exponential decrease of a memory cell area due to the larger scale integration of the DRAM, a capacitance of a memory cell capacitor must be a definite value or above in order to maintain a sufficient immunity to soft errors, namely sufficient S/N ratios, thereby inevitably leading to a thinner insulator film of the memory cell capacitor. The smaller thickness of the film causes, however, some difficulties such as a degradation in film quality and an increase of tunnel currents. In order to decrease such difficulties, such a method is generally adopted that a memory cell plate potential $V_{CF}$ is set to $V_{CC}/2$ so as to decrease an electric field strength in the insulator film.

Moreover, larger scale integration leads to a very small spacing between bit lines, and interference noises which come from adjacent bit lines through coupling capacitance between the bit lines cannot be neglected. As a countermeasure to such interference noises, bit line pairs are adjacently disposed so as to superimpose noises on the bit line pairs in common and cancel the noises. In this case, the potential of the bit lines are set to a potential of $V_{CC}/2$ (a precharge voltage: $V_{BL}$) in a standby period.

Further, in order to attain a faster operation of circuits by reducing a capacitance of a p-n junction formed between an $n^+$ contact region of an n channel MOS transistor and a p well having the $n^+$ region formed therein, for example, a negative voltage $V_{BB}$ of approximately −2 V to −3 V is generally applied to the p well or a p type silicon substrate itself. This negative voltage is also generated by a substrate biasing circuit formed on a chip from a 5 V single power supply.

As described above, such semiconductor memory devices as DRAMs having larger scale integration incorporate therein internal power supplies in which various potentials necessary for their circuit operation are formed within chips even if an external power supply is a 5 V single power supply.

These internal power supply circuits are designed to have circuit configurations in which generated potentials are hardly affected by process variations or the like. Therefore, while those internal power supply potentials are held at designed values in a steady state, the potentials are varied by various factors during the actual operation of the semiconductor memory devices.

In memory cell circuits for storing memory, sense amplifier circuits for carrying out a reading operation, and the like which are driven by those internal power supplies, ranges in which those circuits are normally operable (operating margins) are also varied for internal power supply potentials due to external factors such as process variations.

Thus, testing variations of characteristics of the internal circuits of DRAMs, which occur with dispersion of internal power supply voltages leads to exact evaluations of operating margins, resulting in a higher reliability of DRAMs as systems formed of those internal circuits.

FIG. 12 is a schematic block diagram showing a configuration of a conventional DRAM. With reference to FIG. 12, an address buffer 105 selectively applies externally applied address signals A0–A8 to a row decoder 102 and a column decoder 103. Row decoder 102 selects one of a plurality of word lines WL to drive the selected one in response to a row address signal applied from address buffer 105. Column decoder 103 selects one of a plurality of bit line pairs in response to a column address signal applied from address buffer 105.

A sense amplifier 104 amplifies potential differences between their corresponding bit line pairs. An amplified signal corresponding to the bit line pair selected by column decoder 103 is applied to an output buffer 107. Output buffer 107 amplifies its applied potential and outputs the amplified potential as output data DQ1–DQ8. A data input buffer 106 amplifies externally applied input data DQ1–DQ8. The amplified signal is applied to the bit line pair selected by column decoder 103.

A description will be given on a reading operation of the conventional DRAM shown in the schematic block diagram of FIG. 12 by reference to FIG. 13 of a timing chart of external signals. At a time point at which a /RAS signal falls, a row address signal is accepted into address buffer 105 and then input to row decoder 102. Then, at a time point at which a /CAS signal falls, a column address signal is accepted into address buffer 105 and then input to column decoder 103. At this time, if a /WE signal is held at a logic high level (or an H level), the following series of reading operations are carried out. That is, storage data of a location of a designated row and column are amplified and then transferred to the data output buffer. With an output enable signal (a /OE signal) attaining a logic low level (or an L level), data are output to an output pin.

Similarly, a writing operation will now be described by reference to FIG. 14.

An operation in which a row address and a column address are accepted into address buffer 105 is the same as the one carried out during the reading operation. In the writing operation, however, at a time point at which a /CAS signal falls, the column address is accepted into buffer 105 and data $D_{in}$ (input data) are accepted into data input buffer 106. The accepted data are written on bit lines selected by the column address via an IO line from data input buffer 106. This writing operation is started when both signals /CAS and /WE attain a logic low level. In this case, the level of a /OE signal does not affect a series of operations.

FIG. 15 is an enlarged view of one memory cell MC constituting a memory cell array 101 of FIG. 12 and its peripheral circuits. A description will now be given on internal power supply voltages int. $V_{CC}$, $V_{CP}$, $V_{BL}$ and $V_{BB}$ with reference to FIG. 15.

A consideration will be given on a case where a logic high level is stored in a memory capacitor Cs by way of example. A description will be given on an operation for reading this stored information from memory cell MC. FIG. 16 shows time variations of the level of signals at various parts of FIG. 15.

A reference potential $V_{CP}$ of the memory cell capacitor is biased to a potential $V_{CP}$ ($=V_{CC}/2$) formed in a cell plate voltage generation circuit 111 of FIG. 12, at an arbitrary time.

Further, a p well having an n channel MOS transistor formed therein is biased to a negative potential $V_{BB}$ (approximately −2 V to −3 V) formed in a substrate bias generation circuit 113 of FIG. 12.

At a time $t_0$ in a standby state, since a signal of a logic high level is stored in the memory cell capacitor, a potential of its counter electrode (a storage node) is $V_{CC}$. At this time, a potential of a word line (WL) is at a logic low level, a transistor Q51 is OFF, and memory cell capacitor Cs is in an electrical floating state for bit lines.

On the other hand, a potential of bit lines (BL and /BL) is held at a potential $V_{BL}$ (normally $V_{CC}/2$) formed in a bit line precharge voltage generation circuit 112 of FIG. 12 since a bit line equalize signal (a BLEQ signal) is at a logic high level and transistors Q52, Q53 and Q54 are ON.

Then, at a time $t_1$, the BLEQ signal attains a logic low level, transistors Q52, Q53 and Q54 are turned off, and the bit line pair BL and/BL is put in an electrical floating state.

At a time $t_2$, when the potential of the word line (WL) attains a logic high level, transistor Q51 is turned on, charges stored in memory capacitor Cs are injected into the bit line BL, so that the potential of the bit line BL rises against the bit line /BL. The potential difference made here is, however, only a slight variation of several hundreds mV in general.

At a time $t_3$, the sense amplifier starts its operation in response to its activation signal (not shown), amplifies the above slight potential difference, raises the potential of the bit line BL up to $V_{CC}$ and drops the potential of the bit line /BL down to 0. This potential difference $V_{CC}$ is externally derived as an output signal.

At a time $t_5$, the potential of the word line attains a logic low level and transistor Q51 is turned off, so that the potential of the storage node is again held at the potential $V_{CC}$ (a logic high level) which is formed prior to reading.

At a time $t_6$, the BLEQ signal attains a logic high level, and bit lines BL and /BL are precharged to $V_{BL}$ again.

As described above, since reading of storage information from memory cells is carried out by amplification of small voltages, stability of internal power supply voltages is necessary in order to maintain S/N ratios, and a sufficient operating margin for variations of values of the voltages is also indispensable.

Moreover, normal reading and writing operations of the above described DRAM have the following two features.

One feature is that since internal power supply voltages int. $V_{CC}$, $V_{CP}$, $V_{BL}$, $V_{BB}$ and the like are uniquely set to a definite value once external power supply voltage ext. $V_{CC}$ is determined, it is impossible to externally measure the set value of internal power supply voltages or directly change the set value independently.

The other feature is that even if the /OE signal per se has its internal value int. OE always held at a logic high level, that is, the /OE signal is held at a logic low level, normal reading and writing operations are available.

In order to enable exact evaluations of operating margins for internal power supply voltages, a semiconductor integrated circuit apparatus disclosed in, e.g., Japanese Patent Laying-Open No. 3-160699 has attempted to resolve the problem of the above described first feature. A description will now be made on a configuration and a function of the disclosed embodiment.

FIG. 17 shows a circuit configuration of an internal voltage lowering circuit shown in the above embodiment.

A voltage down converter VD basically includes a differential amplifier circuit comprised of MOSFETs Q11, Q12 and Q13 employing as loads a current mirror circuit comprised of MOSFETs Q1 and Q2.

MOSFETs Q11 and Q12 have their gates being an inversion input terminal and a noninversion input terminal, respectively, and MOSFET Q13 has its gate and its drain coupled in common, acting as a constant current power source. MOSFET Q11 has its gate supplied with a reference voltage $V_{REF}$, and drains of MOSFETs Q1 and Q11 which are coupled in common are further coupled to a gate of a p channel MOSFET Q3. MOSFET Q3 has its source coupled to a power supply voltage ext. $V_{CC}$ and its drain coupled to the gate of MOSFET Q12 and also to an internal power supply voltage supply point int. $V_{CC}$.

If the level of internal power supply voltage int. $V_{CC}$ rises higher than a reference potential $V_{REF}$, for example, conductance of MOSFET Q12 increases, while conductance of MOSFET Q11 decreases. Accordingly, a gate voltage of MOSFET Q3 becomes higher and its conductance becomes smaller, resulting in the lower level of internal power supply voltage int. $V_{CC}$. Conversely, if the level of internal power supply voltage int. $V_{CC}$ falls lower than reference potential $V_{REF}$, the circuit operates to make the level of int. $V_{CC}$ higher oppositely to the above case. In such a manner, the level of int. $V_{CC}$ is converged to and made stable at reference potential $V_{REF}$.

A reference voltage generation circuit VrG is a circuit for applying an internal reference potential $V_r1$ to the above described voltage lowering circuit VD.

A switch circuit SC is a switching circuit for applying reference potential $V_r1$ to voltage lowering circuit VD when a test mode signal $t_e$ applied from a signal source not shown is at a logic low level, and for connecting a reference potential input terminal of voltage lower circuit VD and an external terminal A0 when test mode signal $t_e$ is at a logic high level. FIG. 17 shows such a configuration that both transistors Q14 and Q15 are n channel MOSFETs, and transistors Q14 has its gate supplied with an inversion signal of test mode signal $t_e$, by an inverter N1.

Therefore, the above described internal voltage lowering circuit VD provides a method of controlling internal power supply voltage int. $V_{CC}$ in response to test mode signal $t_e$ during testing by applying an arbitrary reference potential $V_r2$ from external terminal A0.

However, the above described variable internal power supply circuit controlled by the external terminal potential has the following three problems.

The first problem is that there is not provided a method of measuring, during actual operations, potentials applied by the internal power supply circuit to a semiconductor integrated circuit incorporating the internal power supply circuit. A circuit structure enabling the above method is first desirable in order to make analysis of circuit operations and enhance stability and reliability of integrated circuit operations.

The second problem is that no protection is made against overshooting of external terminal potentials to positive values or undershooting of the potentials to negative values which inevitably occur during testing by the external terminal.

If the above described overshooting or undershooting generated at the external terminal is transmitted directly to internal circuits, this leads to destruction of internal storage information or damages and the like of elements in the worst case in, for example, a DRAM.

The third problem is that in the case where internal generation potentials sometimes generate negative potentials such as substrate bias potential $V_{BB}$ as described above, a countermeasure for the above described undershooting to negative values should be extended to more negative potentials.

SUMMARY OF THE INVENTION

One object of the present invention is to enable measuring of a potential generated by an internal power supply circuit incorporated in a semiconductor integrated circuit, from an external terminal during an operation of the semiconductor integrated circuit.

Another object of the present invention is to provide a semiconductor integrated circuit which enables setting of an internal power supply voltage to an arbitrary potential supplied from an external terminal and enables exact evaluations of an operating margin of the semiconductor integrated circuit for the set internal power supply voltage.

Still another object of the present invention is to provide a semiconductor integrated circuit having a function of protecting an internal circuit against positive overshooting and negative undershooting of a supply potential generated at an external terminal.

To summarize, the present invention is a semiconductor integrated circuit device operating in response to an externally applied power supply voltage and including internal voltage generation circuit, an external terminal, signal generation circuit and switch circuit. The internal voltage generation circuit converts the external power supply voltage to a predetermined internal power supply voltage to supply the same. The external terminal inputs/outputs signals to/from the semiconductor integrated circuit device. The signal generation circuit generates a signal for designating an operation mode of the semiconductor integrated circuit device for a test mode. The switch circuit includes a p channel MOS transistor and an n channel MOS transistor connected in series which are provided between an output of the internal voltage generation circuit and the external terminal and are turned on/off at the same time in response to the test mode designating signal.

According to another aspect of the present invention, a potential generated by the internal voltage generation circuit has an opposite polarity to that of an external power supply potential, and a gate of the p channel MOS transistor is biased to the potential of the opposite polarity while the switch circuit is in a nonconducting state.

According to still another aspect of the present invention, a semiconductor integrated circuit device includes internal voltage generation circuit, an external terminal, signal generation circuit, circuit for stopping an operation of the internal voltage generation circuit, and switch circuit. The internal voltage generation circuit converts an external power supply voltage to a predetermined internal power supply voltage to supply the same. The external terminal is supplied with an arbitrary voltage from the outside of the semiconductor integrated circuit device. The signal generation circuit generates a signal for designating an operation mode of the semiconductor integrated circuit device for a test mode. The circuit for stopping the operation of the internal voltage generation circuit stops the operation of an internal voltage in the test mode. The switch circuit includes a p channel MOS transistor and an n channel MOS transistor connected in series which are provided between an output of the internal voltage generation circuit and the external terminal and are turned on/off simultaneously in response to the test mode designating signal.

According to a further aspect of the present invention, a potential generated by the above described internal voltage generation circuit is of opposite polarity to that of an external power supply potential, and a gate of the p channel MOS transistor is biased to the potential of the opposite polarity while the switch circuit is in a nonconducting state.

Accordingly, a main advantage of the present invention is that since an internal power supply voltage is monitored from an external terminal through switch circuit including a p channel MOSFET and an n channel MOSFET connected in series, an internal circuit of a semiconductor integrated circuit is protected against positive or negative overshooting of a potential of the external terminal.

Another advantage of the present invention is that since a voltage which is applied by an internal power supply to an internal circuit of a semiconductor integrated circuit can be varied from an external terminal through switch circuit including a p channel MOSFET and an n channel MOSFET connected in series, the internal circuit of the semiconductor integrated circuit is protected against positive or negative overshooting of a potential of the external terminal, and evaluations can be made on an operating margin for the internal power supply voltage of the semiconductor integrated circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a diagram showing combinations of address signals and control signals of the present invention.

DESCRIPTION OF THE PREFERRED EMBODIMENTS

Figure 1:
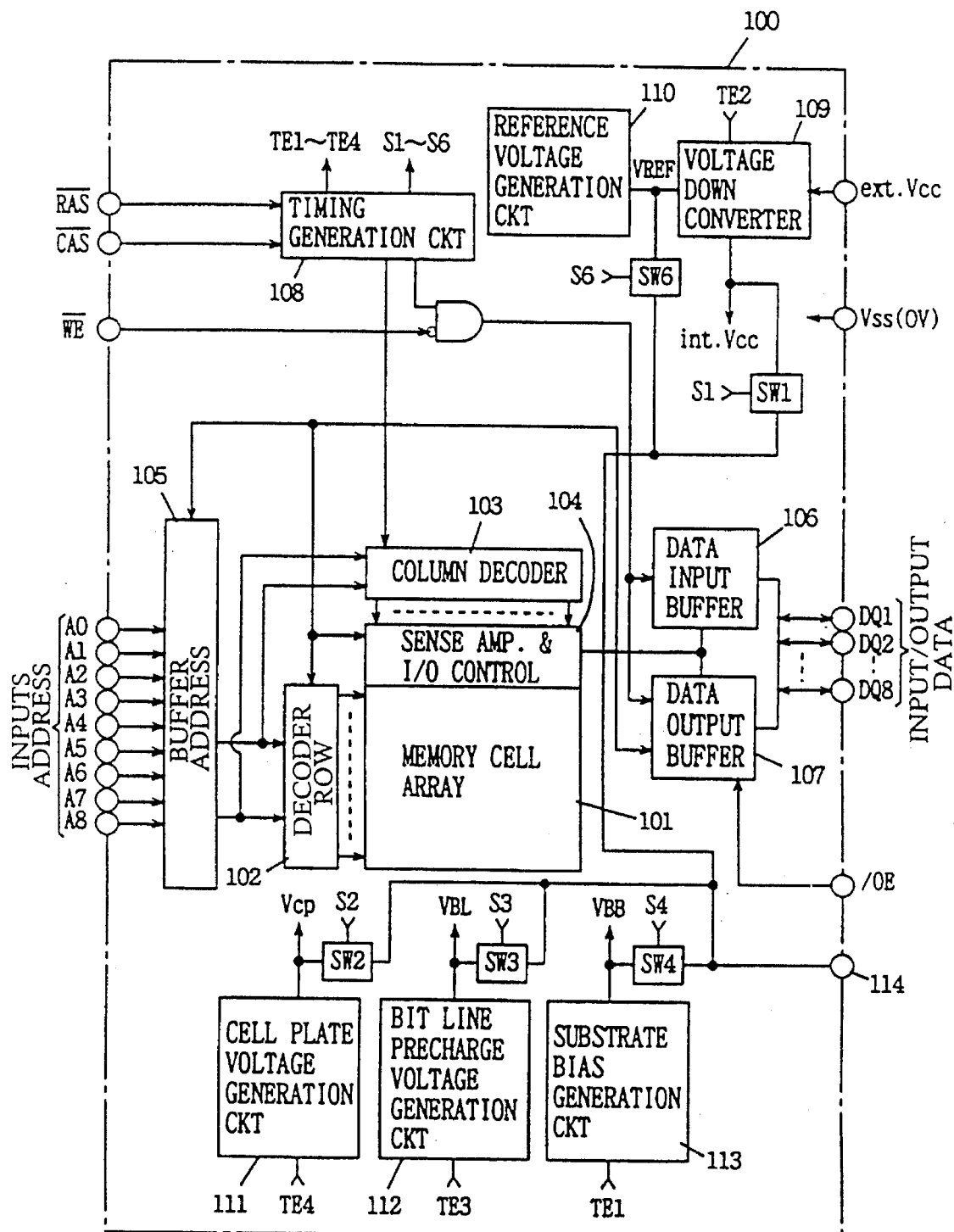
FIG. 1 is a schematic block diagram of a DRAM according to a first embodiment of the present invention.

FIG. 1 is a schematic block diagram showing a DRAM which is one embodiment of the present invention.

Figure 12:
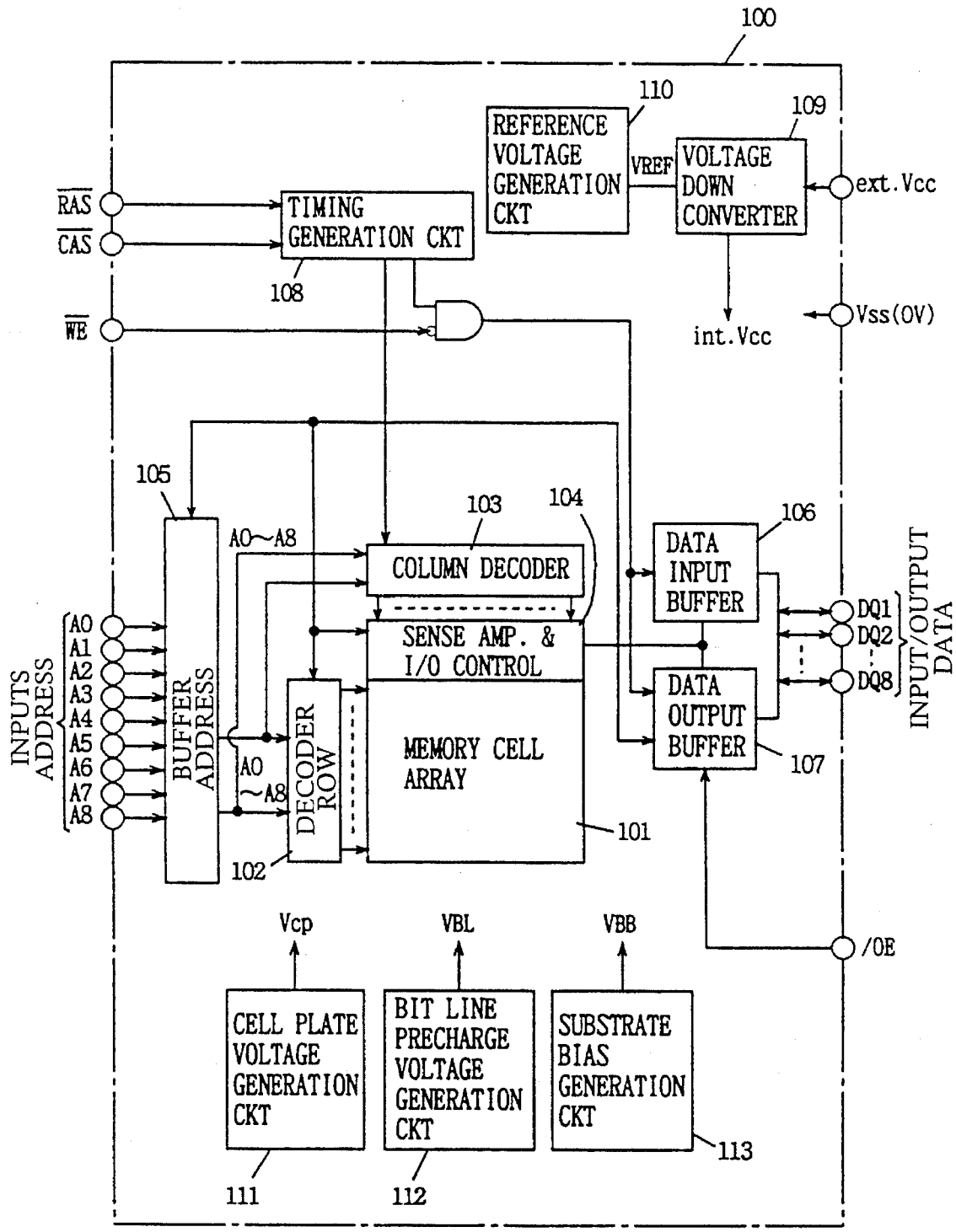
FIG. 12 is a schematic block diagram showing a conventional DRAM.
Figure 13:
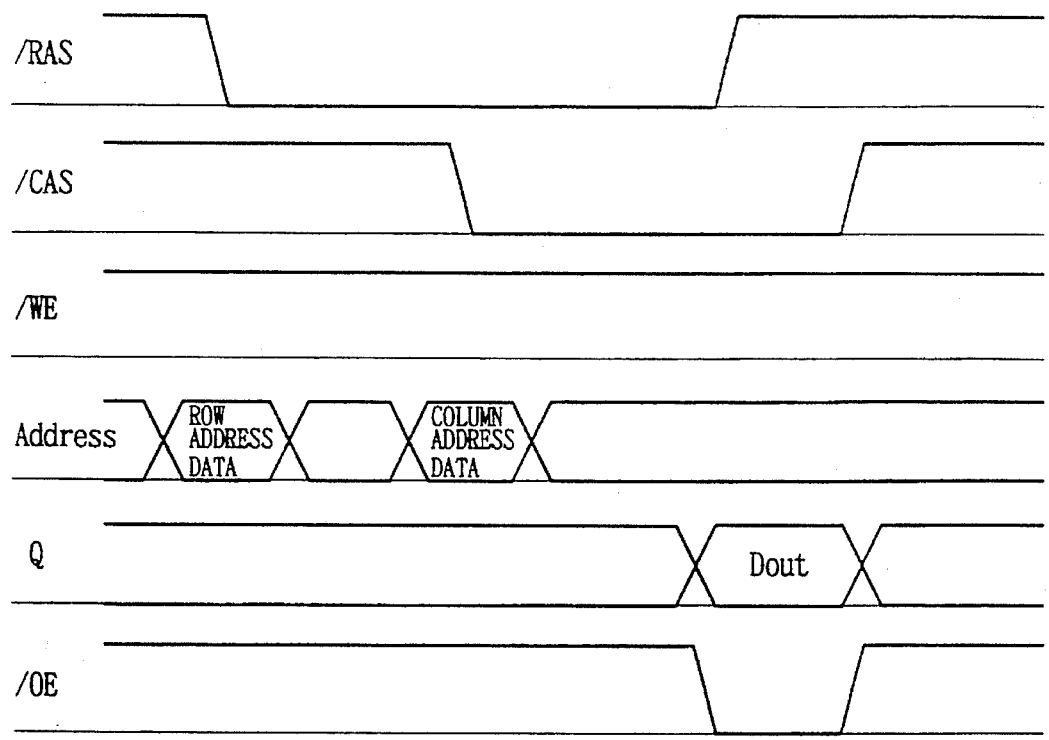
FIG. 13 is a timing chart of a reading operation of the conventional DRAM.
Figure 14:
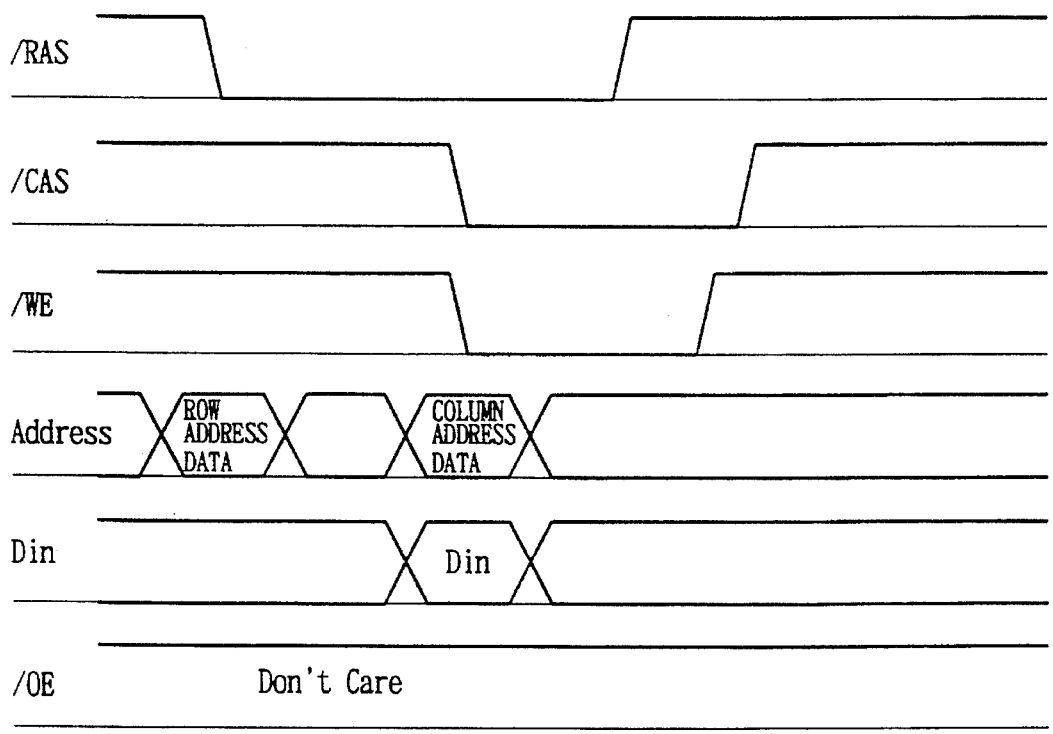
FIG. 14 is a timing chart of a writing operation of the conventional DRAM.
Figure 15:
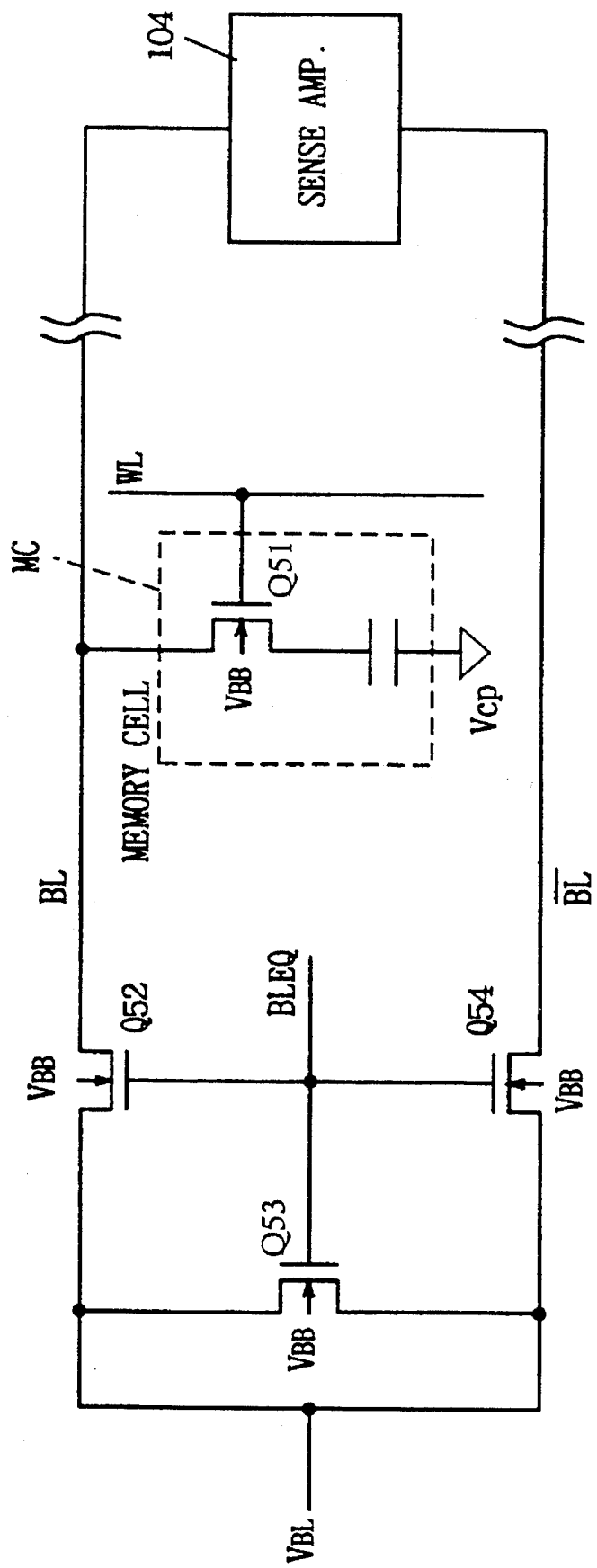
FIG. 15 is a circuit diagram of a memory cell portion of the conventional DRAM.
Figure 16:
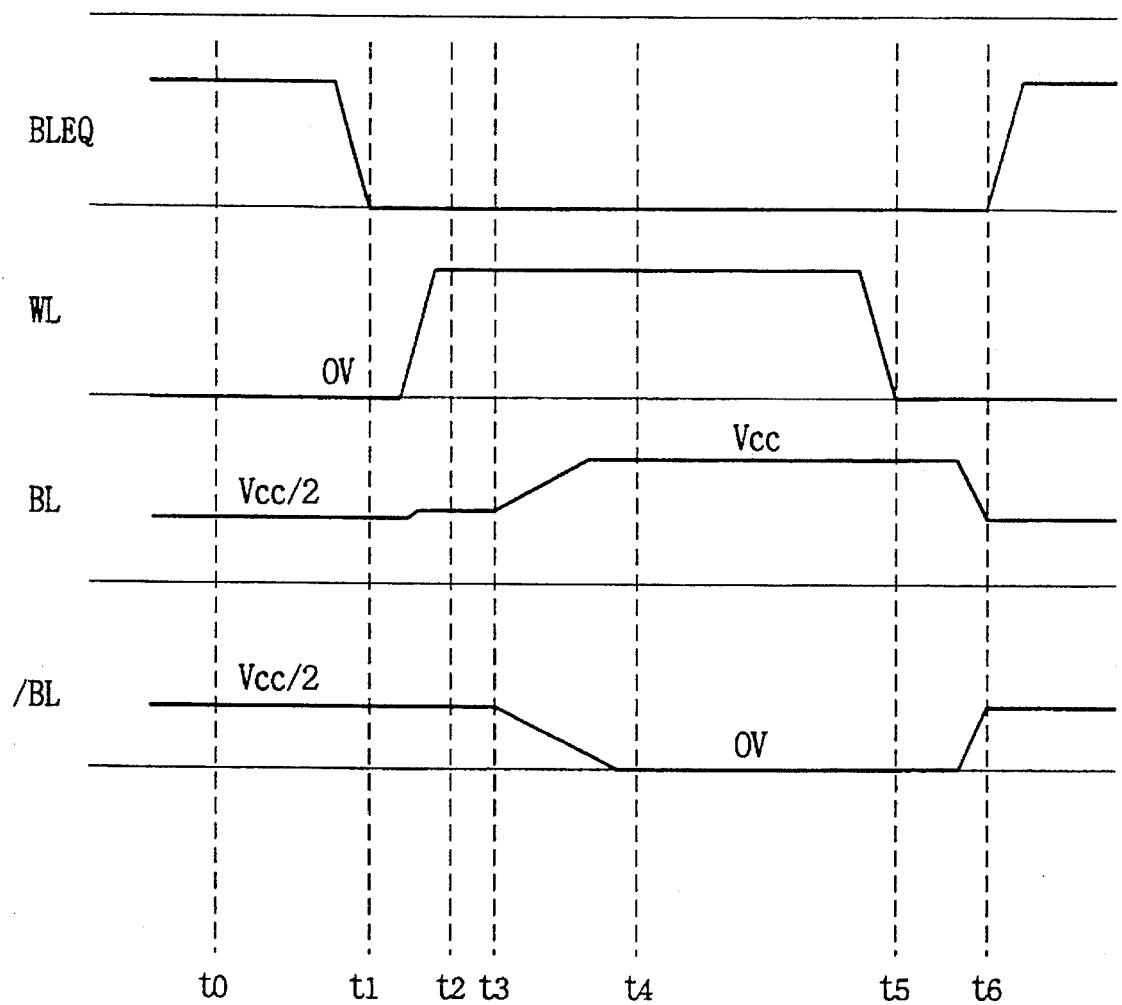
FIG. 16 is a timing chart of a writing operation of the conventional DRAM.

Since the embodiment shown in FIG. 1 is the same as the conventional example shown in FIG. 12 except the following point, a description will not be given on common parts.

That is, an output of a voltage down converter 109 is connected to an external terminal 114 through a switch circuit SW1 which is switching controlled in response to a test mode designating signal S1. An output of a reference voltage generation circuit 110 is also connected to external terminal 114 through a switch circuit SW6 which is switching-controlled in response to a test mode designating signal S2.

Further, an output of a cell plate voltage generation circuit 111 is connected to external terminal 114 through a switch circuit SW2 which is switching controlled in response to test mode designating signal S2. An output of a bit line precharge voltage generation circuit 112 is connected to external terminal 114 through a switch circuit SW3 which is switching-controlled in response to a test mode designating signal S3. An output of a substrate bias generation circuit 113 is connected to external terminal 114 through a switch circuit SW4 which is switching controlled in response to a test mode designating signal S4. A description will now be given individually on the operation of each switch and each internal power supply circuit shown in FIG. 1.

Figure 2:
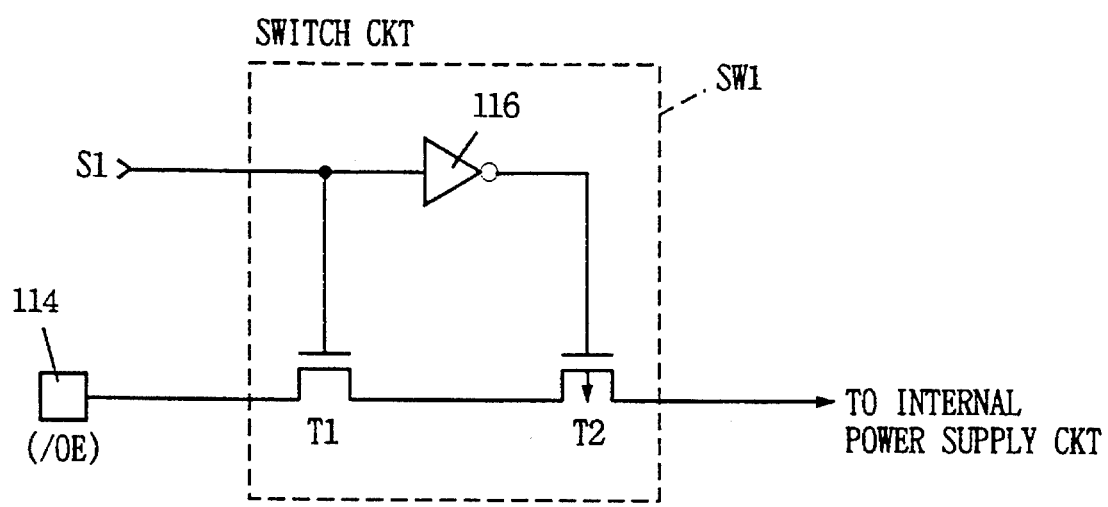
FIG. 2 is a diagram showing a configuration of a switch circuit of the first embodiment of the present invention.

FIG. 2 shows a circuit configuration of the switch circuits denoted with SW1–SW4 in FIG. 1. Each of the switch circuits includes an n channel MOS transistor T1 and a p channel MOS transistor T2 connected in series. External terminal 114 is connected to a drain of n channel MOS Transistor T1. n channel MOS transistor T1 and p channel MOS transistor T2 have their sources connected to each other, and p channel MOS transistor T2 has its drain connected to an internal power supply circuit, e.g., an output of voltage lowering circuit 109 of FIG. 1.

n channel MOS transistor T1 has its gate provided with a test mode designating signal, e.g., S1 of FIG. 2, while p channel MOS transistor T2 has its gate provided with an inversion signal of test mode designating signal S1, which is inverted by an inverter 116. Accordingly, with signal S1, which is inverted being at a logic high level, the switch circuit is turned on, whereas with signal S1 being at a logic low level, the switch circuit is turned off.

Figure 3:
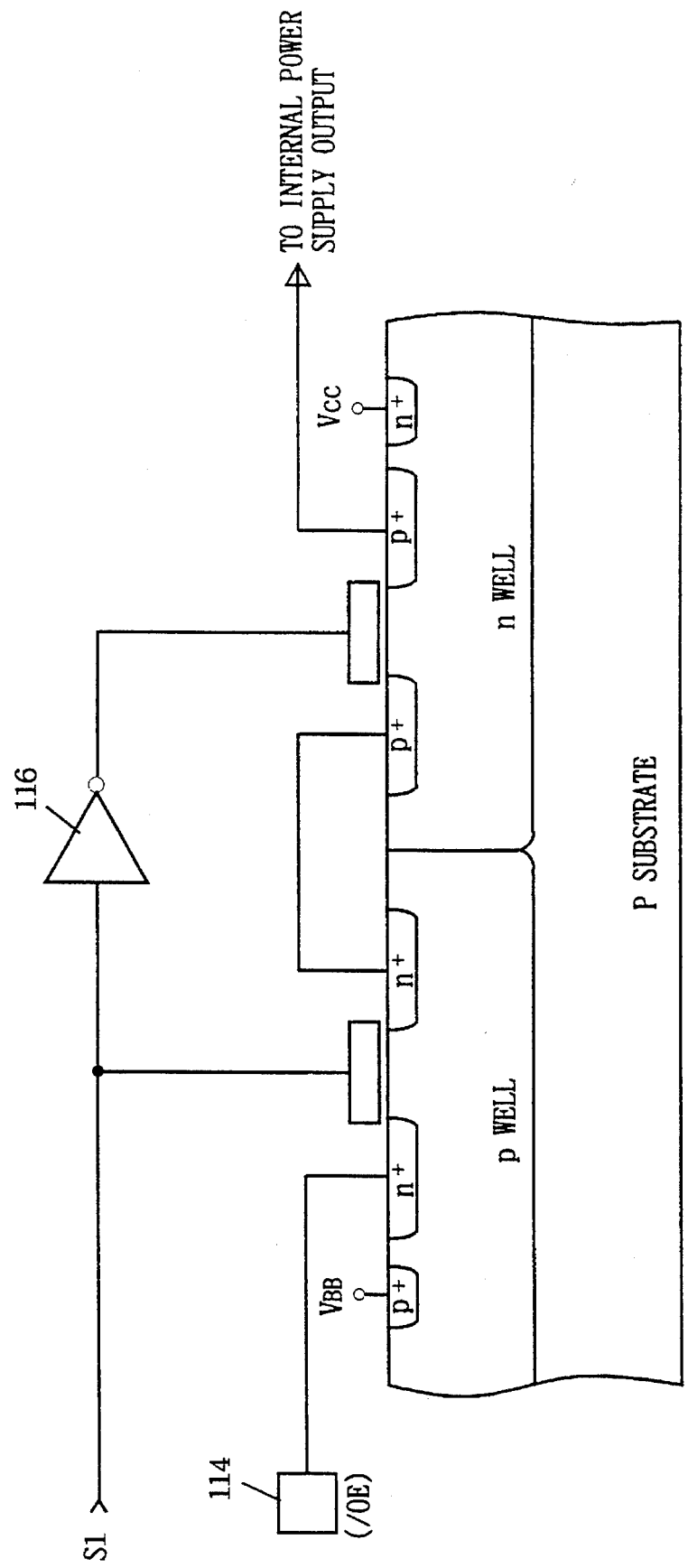
FIG. 3 is a view showing a cross-sectional structure of a transistor portion of FIG. 1.

FIG. 3 is a diagram showing a cross section of parts corresponding to n channel MOS transistor T1 and p channel MOS transistor T2 of the switch circuit of FIG. 2, in the DRAM of FIG. 1. A description will now be given on cut-off characteristics for a voltage input from external terminal 114 to that switch, with reference to FIG. 3. It is assumed, as an example, that in the case where a p type Si substrate is used, an n channel MOS transistor and a p channel MOS transistor are formed in a p well and an n well, respectively.

Normally, the p well is biased to a ground potential $V_{SS}$ or a substrate bias $V_{BB}$, while the n well is biased to an external power supply voltage ext. $V_{CC}$. Therefore, if test mode designating signal S1 attains a logic high level (=ext. $V_{CC}$), a conductive n type inversion layer is formed just beneath the gate of the n channel MOS transistor, and a logic low level (=0 V) is applied to the gate of the p channel MOS transistor and a conductive p type inversion layer is formed just beneath that gate.

If the potential of external terminal 114 exceeds $V_{CC}$ and overshoots to a positive value, the n type inversion layer disappears in the vicinity of the drain of the n channel MOS transistor, resulting in a nonconducting state since the gate potential of the n channel MOS transistor is $V_{CC}$.

On the other hand, if the potential of external terminal 114 falls below 0 V and undershoots to a negative value, the p type inversion layer disappears in the vicinity of the source of the p channel MOS transistor, resulting in a nonconducting state since the gate potential of the p channel MOS transistor is 0 V.

As described above, since the n channel MOS transistor and the p channel MOS transistor are connected in series in the switch circuit of FIG. 3, the conducting state becomes the nonconducting state in both cases where the potential of external terminal 114 overshoots to a positive value and undershoots to a negative value. This makes it possible to protect internal storage information or the like from being destroyed without the overshot or undershot voltage being directly applied to the internal circuit connected to the internal power supply circuit.

Figure 4:
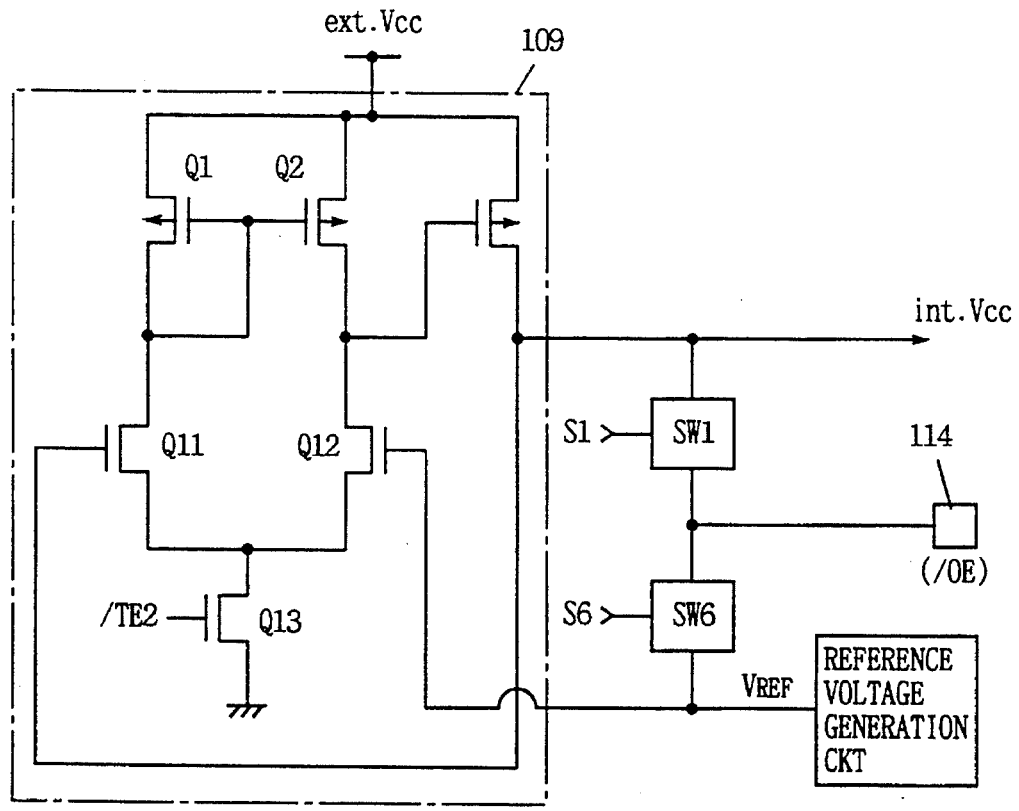
FIG. 4 is a schematic block diagram showing one important part of the first embodiment of the present invention.
Figure 17:
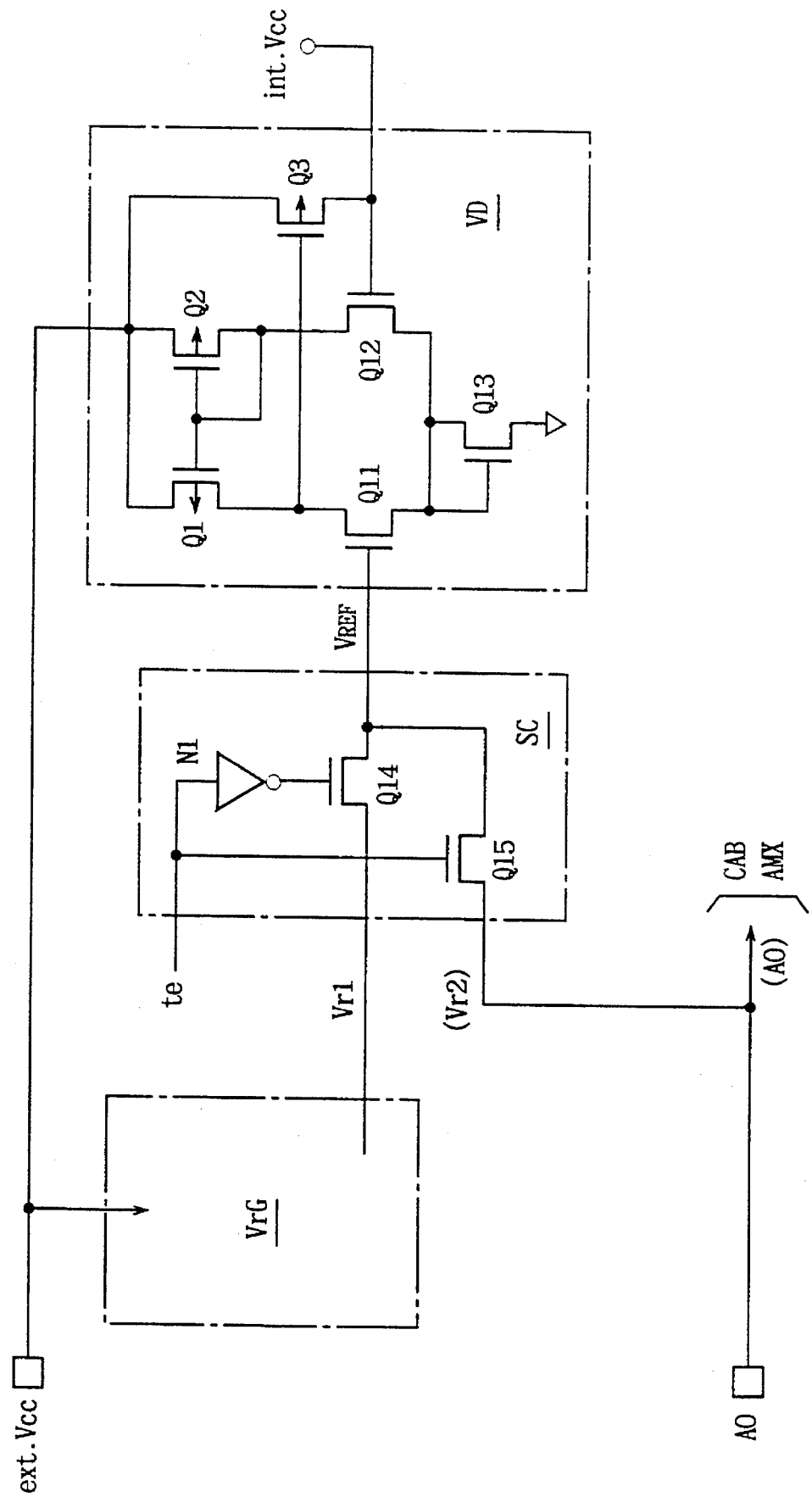
FIG. 17 is a diagram showing a conventional method of varying an internal voltage.

FIG. 4 is a schematic block diagram in a case where internal voltage lowering circuit 109 of FIG. 1 is monitored by external terminal 114 by employing the above described switch circuit. Internal voltage lowering circuit 109 has approximately the same circuit configuration as that of the conventional example of FIG. 17 except the point that a gate potential of a constant current power supply transistor Q13 of a differential amplifier circuit can externally be controlled.

A description will now be given on a case where this n channel MOS transistor Q13 is on, that is, a test mode designating signal (TE2 signal) is at a logic low level. When a test mode designating signal S1 is at a logic high level and a test mode designating signal S6 is at a logic low level, switch circuit SW1 is turned on and switch circuit SW6 is turned off, so that it is possible to monitor the output value of an internal voltage down converter (int. $V_{CC}$) by external terminal 114.

Conversely, when test mode designating signal S1 is at a logic low level and test mode designating signal S6 is at a logic high level, switch circuit SW1 is turned off and switch circuit SW6 is turned on, so that it is possible to monitor an output $V_{REF}$ of a reference voltage generation circuit by external terminal 114.

Figure 5:
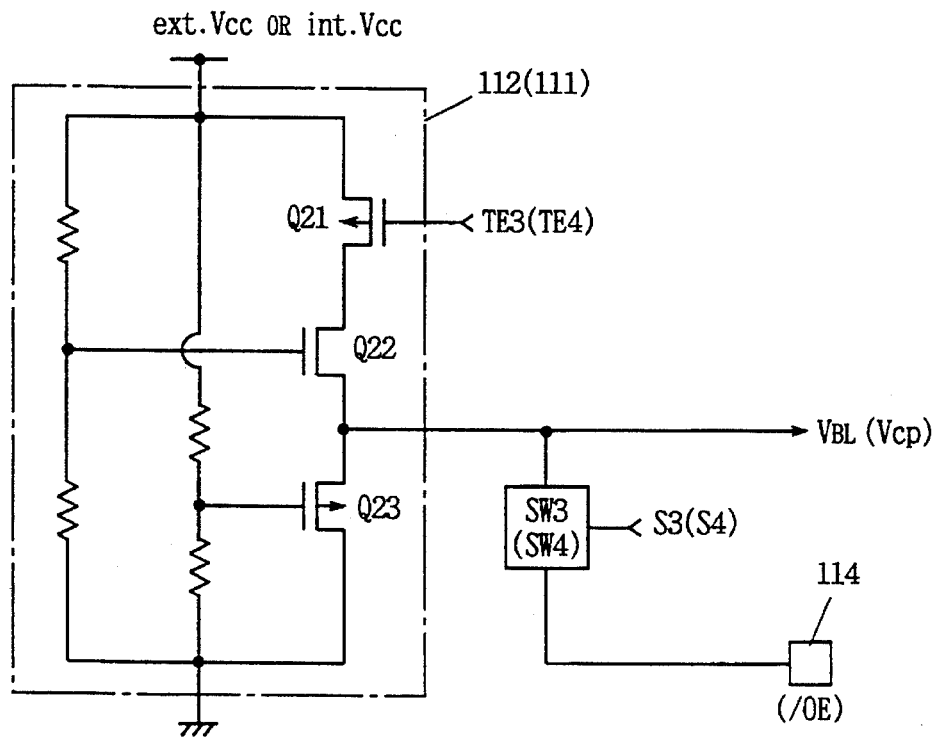
FIG. 5 is a schematic block diagram showing another important part of the first embodiment of the present invention.

FIG. 5 is a schematic block diagram in a case where an output of cell plate voltage generation circuit 111 or an output of bit line precharge voltage generation circuit 112 shown in FIG. 1 is monitored by external terminal 114 by use of the above described switch circuit. A brief description will now be given on the operation of cell plate voltage generation circuit 111 or bit line precharge voltage generation circuit 112.

Both voltage generation circuits are circuits for generating a voltage of $V_{CC}/2$ from an external power supply voltage ext. $V_{CC}$ and having a totally identical basic configuration. The basic configuration of those circuits is that an n channel MOS transistor Q22 and a p channel MOS transistor Q23 are connected in series, and currents flowing through those MOS transistors are turned on/off by a p channel MOS transistor Q21 which is a switching transistor.

Consideration will be made on a case where p channel MOS transistor Q21 is on, that is, a test mode designating signal TE3 is at a logic low level. n channel MOS transistor Q22 has its gate supplied with a voltage of $V_{CC}/2+|V_{thn}|$ ($V_{thn}$: a threshold value of an n channel transistor), while p channel MOS transistor Q23 has its gate supplied with a voltage of $V_{CC}/2-|V_{thp}|$ ($V_{thp}$: a threshold value of a p channel transistor), so that a voltage $V_{CC}/2$ is generated at an output node.

If a test mode designating signal S3 (S4) attains a logic high level, switch circuit SW3 (SW4) is turned on, thereby enabling monitoring of an internal power supply voltage $V_{BL}$ or $V_{CP}$ by external terminal 114.

A description will be given on a circuit configuration for monitoring a voltage generated by an internal power supply when the internal power supply voltage is a negative potential.

First, an explanation will be made, with reference to a schematic block diagram of FIG. 6, an operation of substrate bias generation circuit 113 which is an internal power supply circuit for generating a negative potential. A signal generated at a ring oscillator 200 is input to a drive circuit 300 via an NOR circuit 117 on its way. At that time, if a test mode signal TE1 is at a logic low level, an output of the NOR circuit becomes an inversion of the input from ring oscillator 200. If test mode designating signal TE1 is at a logic high level, an output of the NOR circuit is always at a logic low level, so that the operation of this circuit stops.

A case will now be described where test mode designating signal TE1 is at a logic low level. Both a potential of a point A and $V_{BB}$ are initially 0 V. If an output from a drive circuit 300 rises from 0 V up to $V_{CC}$, the point A rises to a logic high level due to a pumping capacitance $C_p$. This causes a p channel MOS transistor Q31 to turn on to attempt to lower the point A down to the level of $V_{th}$. (At this time, a p channel MOS transistor Q32 remains off.) When the potential of the point A becomes $V_{th}$, p channel MOS transistor Q31 is turned off.

Then, if an output from drive circuit 300 falls from $V_{CC}$ down to 0 V, the point A falls to the level of $-(V_{CC}-V_{th})$ by pumping capacitance $C_p$. In response to this, p channel MOS transistor Q32 is turned on, so that electrons are injected from the point A to the substrate. Thus, the potential of the point A rises from the level of $-(V_{CC}-V_{th})$ up to the level of $-V_{th}$. (p channel MOS transistor Q31 remains off at this time.) p channel MOS transistor Q32 is turned off at a time point when the potential of the point A reaches $-V_{th}$. Consequently, the potential of $V_{BB}$ becomes a slight negative value.

Repeating the foregoing operation causes the potential of $V_{BB}$ to become a negative value gradually, and an injection of electrons from the point A via p channel MOS transistor Q32 to the substrate stops at the time point of $V_{BB}=-(V_{CC}-2V_{th})$ is That is, a negative potential of $V_{BB}$ ($V_{CC}-2V_{th}$) is applied to a substrate by the above described substrate biasing circuit 113.

Figure 7:
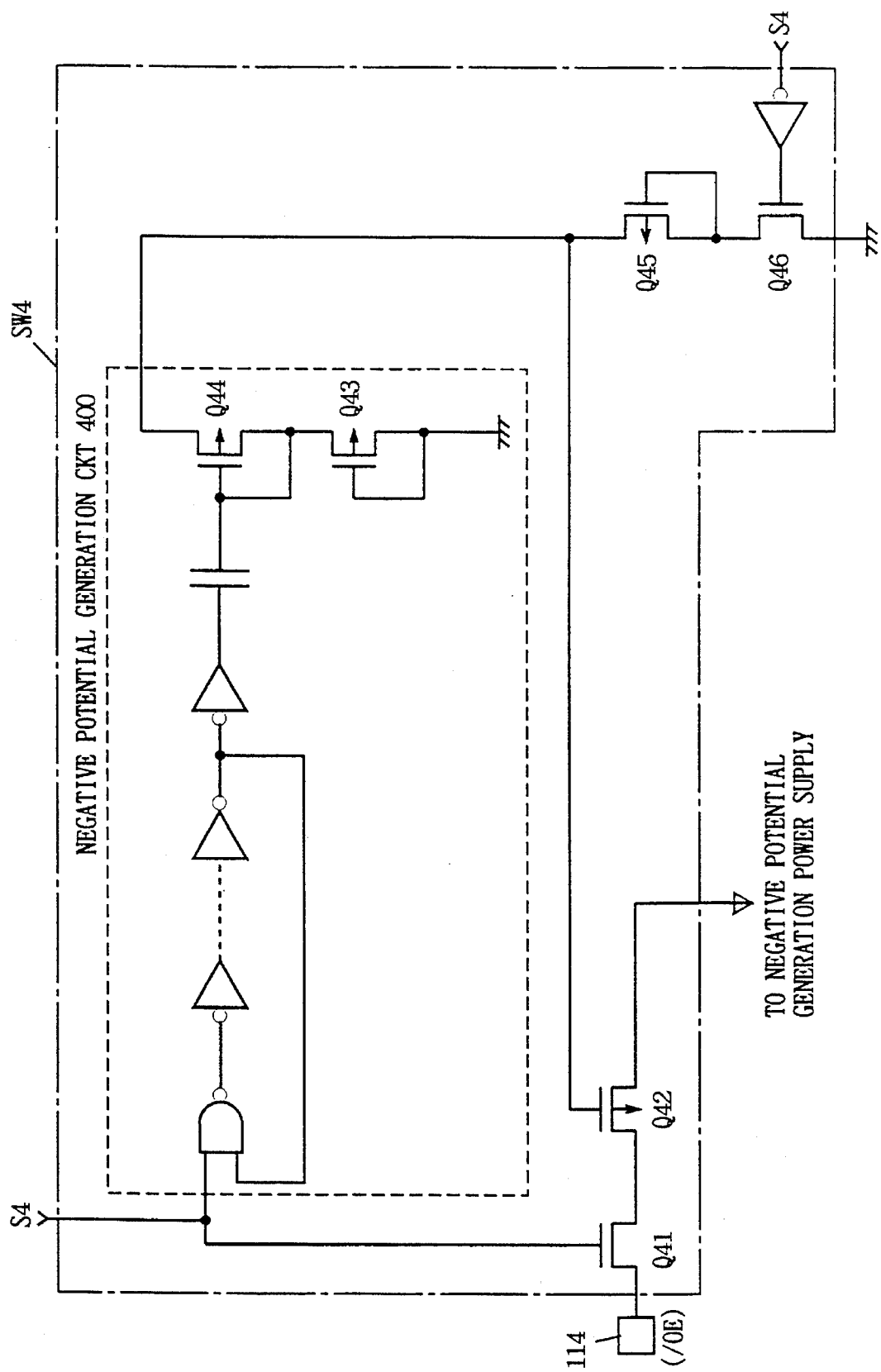
FIG. 7 is a schematic block diagram showing still another important part of the first embodiment of the present invention.

FIG. 7 shows a circuit configuration for monitoring from external terminal 114 a negative potential which is generated at substrate bias generation circuit 113 of FIG. 1.

This circuit configuration is basically identical to the switch circuit of FIG. 2 in that an n channel MOS transistor and a p channel MOS transistor are connected in series. The difference between those circuit configurations is that when a test mode designating signal S4 is at a logic high level, a negative potential is applied to a gate of a p channel MOS transistor Q42 by a negative potential generation circuit 400 which is basically identical to substrate bias generation circuit 113 described with reference to FIG. 6.

This embodiment employs such a configuration that when test mode designating signal S4 is at a logic low level, an n channel MOS transistor Q46 is turned on, and the gate of p channel MOS transistor Q42 is supplied with a threshold voltage of a p channel MOS transistor Q45. If a voltage which causes p channel MOS transistor Q42 to turn off is applied when test mode designating signal S4 is at a logic low level, this embodiment is not particularly limited to such a configuration.

In this case also, for the same reason as those of FIGS. 2 and 3, that switch circuit is able to cut off the transmission of the overshooting or undershooting of the external terminal potential to the internal circuit. When switch circuit SW4 is open, an n channel MOS transistor Q41 has its gate provided with a logic high level signal $V_{CC}$. If a potential higher than this signal $V_{CC}$ is applied to a drain of this transistor, an n type inversion layer just beneath the gate disappears in the vicinity of the drain and consequently transistor Q41, that is, switch circuit SW4 becomes non-conductive. On the other hand, the gate of p channel MOS transistor Q42 is biased to a negative potential (equal to $V_{BB}$ in this case). If a potential not higher than this negative potential is applied to the source of this transistor, a p type inversion layer just beneath the gate disappears in the vicinity of the source and consequently transistor Q42, that is, switch circuit SW4 becomes non-conductive.

Accordingly, if test mode designating signal S4 attains a logic high level in the structure of switch circuit SW4 of FIG. 7, the conducting state is cut off in both cases where the potential of external terminal 114 overshoots to a positive value and undershoots to a negative value. Thus, neither overshooting voltage nor undershooting voltage is directly applied to an internal power supply circuit and an internal circuit connected thereto. This makes it possible to protect internal storage information and the like from being destroyed and to measure internal power supply potentials of a semiconductor integrated circuit in highly stable and reliable states.

A description will now be given on a circuit configuration for externally controlling a voltage corresponding to an internal power supply potential for an arbitrary value.

First of all, as to internal voltage down converter 109 of FIG. 4, in a test mode, a test mode designating signal TE2 attaining a logic high level (a signal/TE2 attaining a logic low level) causes n channel MOS transistor Q13 to turn off, thereby stopping the operation of the voltage lowering circuit. At the same time, a control signal S1 attaining a logic high level causes switch circuit SW1 to turn on, thereby supplying a voltage from external terminal 114.

In this case, the following approach can also be made like a conventional example (Japanese Patent Laying-Open No. 3-160699). With a test mode designating signal TE2 attaining a logic low level and a test mode designating signal S6 attaining a logic high level, switch circuit SW6 is turned on, thereby applying an arbitrary reference potential $V_{REF}$ from external terminal 114 to change an internal down converted voltage int. $V_{CC}$ to an arbitrary value.

The foregoing procedure enables evaluations of an operating margin of a DRAM, with internal down converted supply voltage int. $V_{CC}$ being externally changed to an arbitrary value.

With regard to bit line precharge voltage generation circuit 112 (cell plate voltage generation circuit 111) of FIG. 5, a test mode designating signal TE3 (TE4) attaining a logic high level in a test mode causes p channel MOS transistor Q21 to turn off, thereby stopping this circuit operation. At the same time, a test mode designating signal S3 (S4) attaining a logic high level causes switch circuit SW3 (SW4) to turn on, thereby applying arbitrary voltages from external terminal 114.

In this case also, a bit line precharge voltage $V_{BL}$ and a cell plate voltage $V_{CP}$ can externally be changed to arbitrary values.

A description will now be given on a circuit configuration for externally controlling a voltage corresponding to an internal power supply voltage having opposite polarity to an external power supply, for an arbitrary value.

Figure 6:
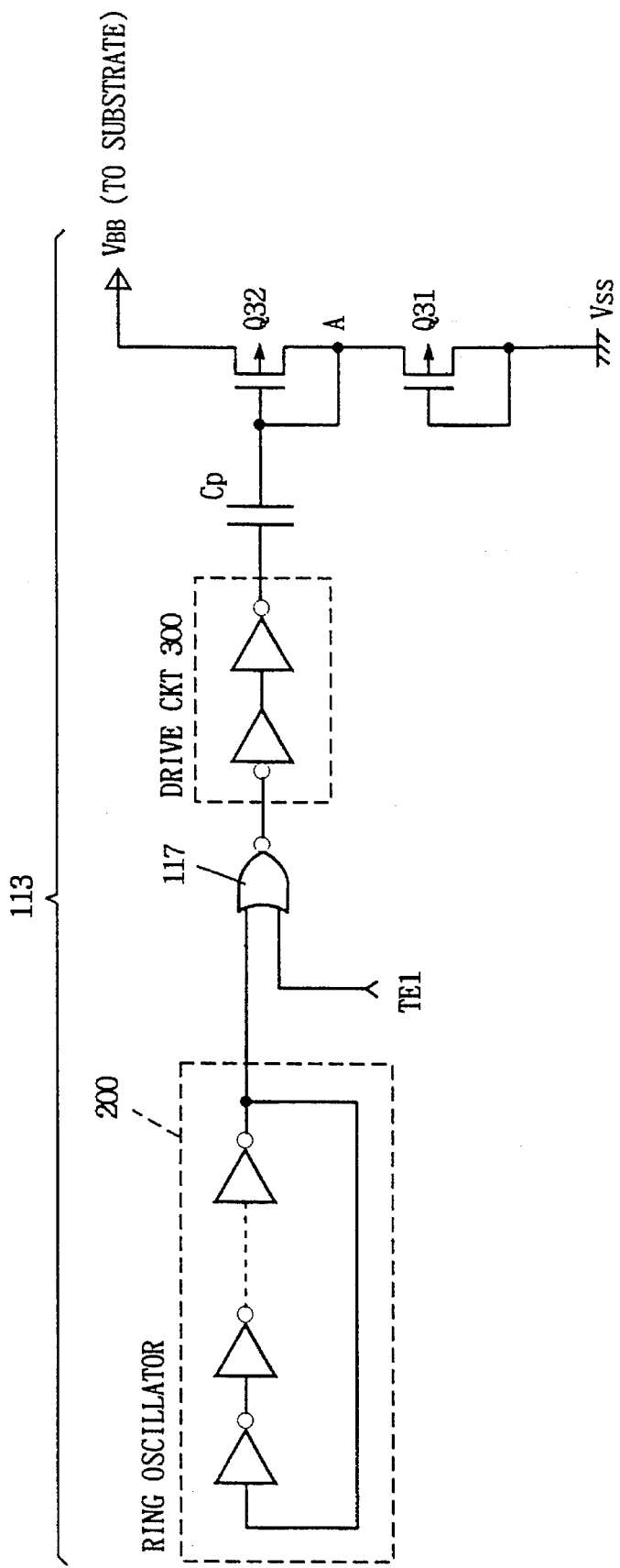
FIG. 6 is a schematic block diagram showing a substrate bias generation circuit.

First, a test mode designating signal TE1 attaining a logic high level in substrate bias generation circuit 113 of FIG. 6 stops the operation of this circuit, and a test mode designating signal S4 attaining a logic high level in FIG. 7 causes the switch circuit to turn on, thereby applying an arbitrary potential from external terminal 114.

The foregoing procedure enables external control of a voltage corresponding to a negative potential $V_{BB}$ for an arbitrary value.

While dedicated external terminal 114 is employed for external monitoring and control of internal power supply voltages in the above described first embodiment, other terminals which are in use of other signal inputs in a normal mode can also be employed. A DRAM is normally encapsulated in a package of 28 pins, for example; however, as the number of address input pins and data input/output pins increases with an increase in integration scale, few unused free pins tend to exist in a normal operation mode.

Pins, which are normally employed for input of data or control signals, are thus necessary to be used as the above described external terminal in a test mode.

Figure 8:
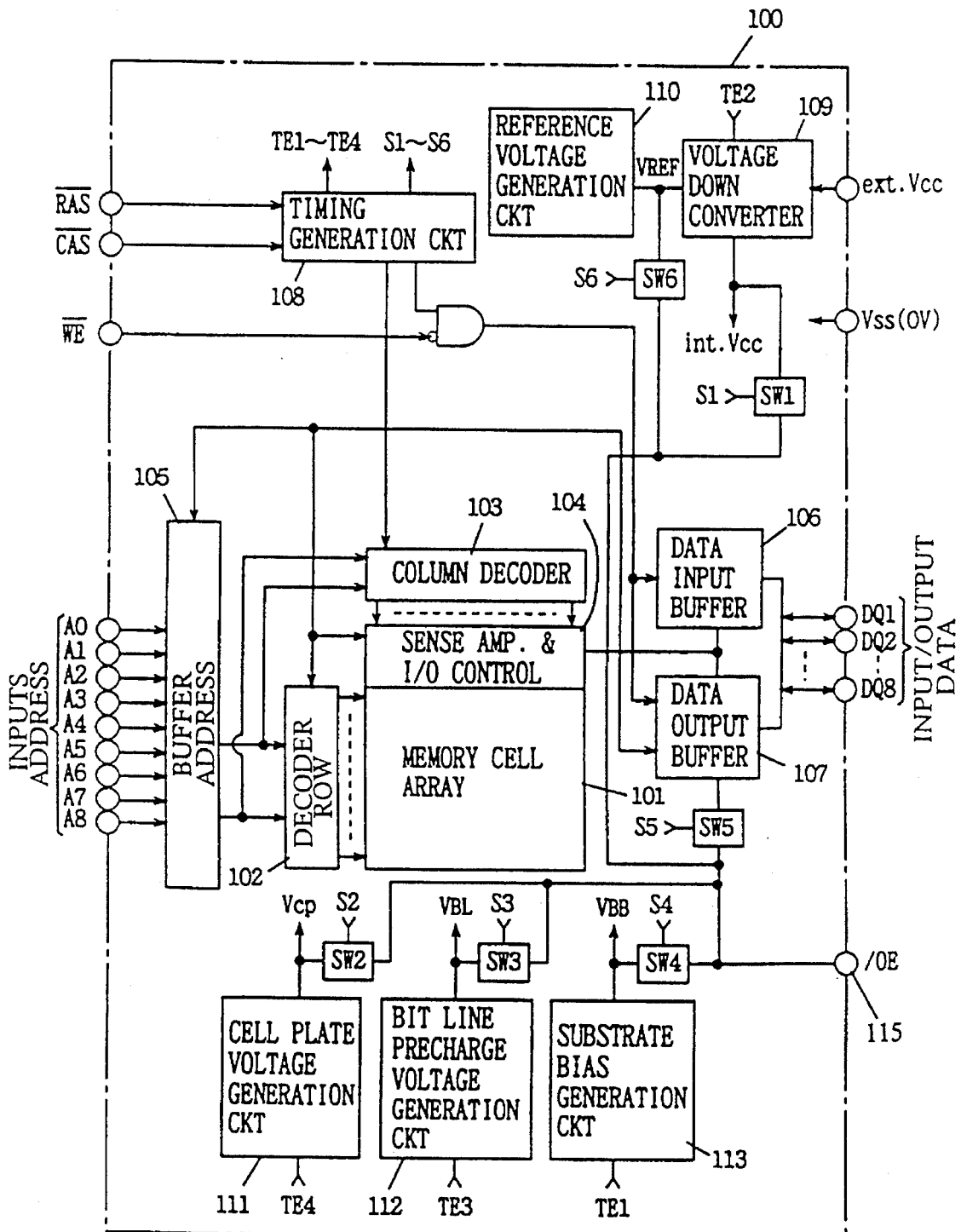
FIG. 8 is a schematic block diagram of a DRAM according to a second embodiment of the present invention.
Figure 9:
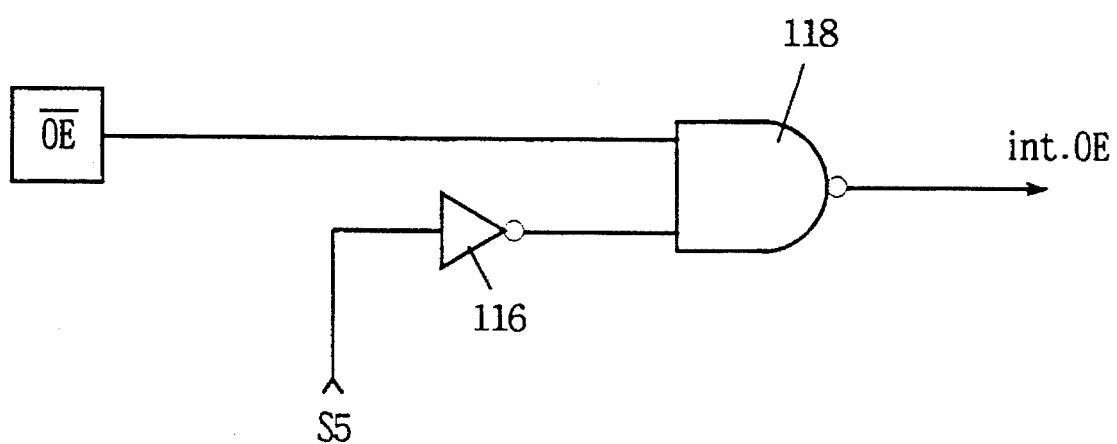
FIG. 9 is a diagram showing a configuration of a switch circuit SW5 of FIG. 8.

According to a second embodiment of the present invention, an output enable (OE) terminal 115 is particularly employed as the above described external terminal which is in use of other signal inputs in a normal operation. FIG. 8 shows a schematic block diagram of the second embodiment. The description has already been made in the background art section that normal reading and writing operations are possible even if the /OE signal is held at a logic low level in the conventional DRAM. Thus, a circuit of FIG. 9 denoted with SW5 in FIG. 8 is interposed between output enable terminal 115 and the output buffer. In the circuit of FIG. 9, if a test mode designating signal S5 attains a logic high level, this signal is applied via an inverter 116 to one input terminal of a two-input NAND circuit 118. Accordingly, a signal int. OE of an NAND output is held at a logic high level, that is, equivalent to a state where a signal /OE is held at a logic low level, independently of the level of the output enable terminal connected to the other input terminal of two-input NAND circuit 118. If test mode designating signal S5 is at a logic low level, NAND output signal int. OE matches the signal /OE. Therefore, if test mode designating signal S5 attains a logic high level, signal /OE is held at a logic low level, thereby enabling constant reading and writing operations. If test mode designating signal S5 attains a logic low level, the same operation as that under the normal /OE signal can be carried out.

In the foregoing first and second embodiments, test mode designating signals S1–S6 and TE1–TE4 are generated in an internal timing generation circuit 108 in a test mode in accordance with quasi signals input to the address input terminal.

FIG. 10 shows one example of combinations of quasi address signals and control signals. For example, in a case where an internal down converted supply voltage is externally monitored, with application of quasi address signals $(A_0, A, A_2, A, A_4, A_5, A_6, A_7, A_8) = (0, 0, 0, 0, /, /, /, /)$ (/ is arbitrary), test mode designating signals S1, S5 and /TE2 are generated as signals of a logic high level at internal timing generation circuit 108.

Figure 11:
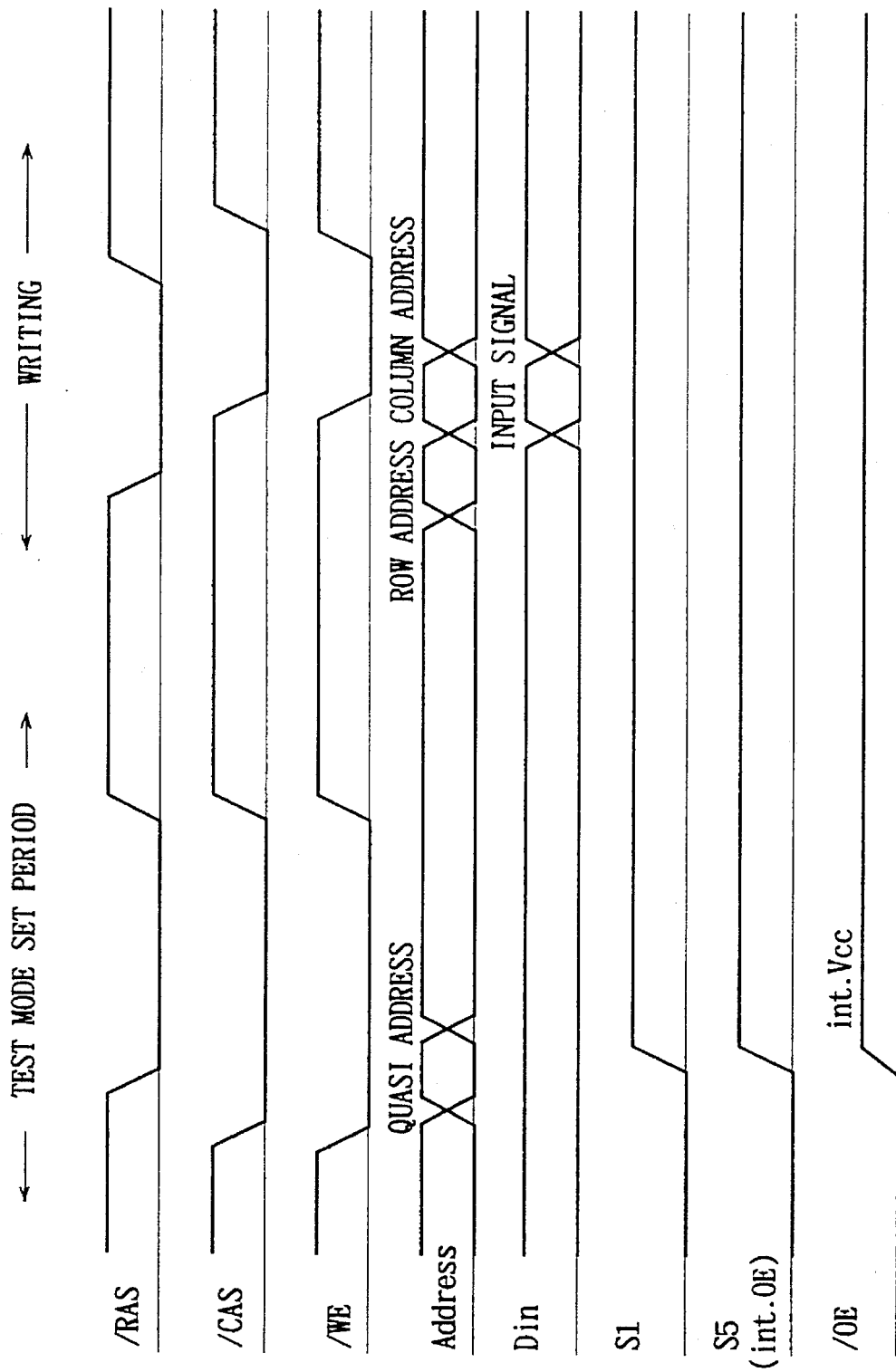
FIG. 11 is a timing chart of the second embodiment of the present invention.

A description will now be given on one example of a timing chart of the operation of the internal timing generation circuit with reference to FIGS. 8 and 11. First of all, with execution of a WCBR (/WE, /CAS before /RAS) cycle, internal timing generation circuit 108 generates signals S1 and S5 corresponding to input quasi address signals and enters in a test mode. In this state, like a normal operation, a row address is accepted with the fall of a /RAS signal, a column address is accepted with the fall of a /CAS signal, and at the same time, input data is accepted, thereby carrying out a writing operation. At this time, since control signal S5 attaining a logic high level causes int. OE signal to be held at a logic high level, that is, /OE signal at a logic low level, a normal writing operation is carried out. Further, test mode designating signal S1 attaining a logic high level causes switch circuit S1 to turn on, thereby enabling measuring of internal down converted voltage int. $V_{CC}$ by output enable terminal /OE.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device operating with an externally applied power supply voltage, comprising:

internal voltage generating means for converting said external power supply voltage to a predetermined internal power supply voltage;

an external terminal employed for an input/output of a signal to/from said semiconductor integrated circuit device;

means for generating a signal for designating a test mode; and switch means including a p channel MOS transistor and an n channel MOS transistor connected in series, provided between an output of said internal voltage generating means and said external terminal and simultaneously opening and closing in response to said test mode designating signal.

2. The semiconductor integrated circuit device according to claim 1, wherein a potential of said predetermined internal power supply voltage generated by said internal voltage generating means has an opposite polarity to a polarity of said external power supply potential, and the p channel MOS transistor has its gate biased to the potential of opposite polarity with said switch means being rendered conductive.

3. The semiconductor integrated circuit device according to claim 1, wherein said semiconductor integrated circuit device includes a dynamic RAM, and said external terminal is employed for other signal inputs in a normal operation.

4. The semiconductor integrated circuit device according to claim 3, wherein said external terminal includes an output enable terminal for applying a driving signal to a data output buffer, further including a two-input logic circuit having a first input for receiving a signal from said output enable terminal, a second input for receiving said test mode designating signal, and an output for applying the driving signal to the data output buffer, and switching in response to said test mode signal between a first state where a signal from said output terminal is output as it is and a second state where a signal for driving the data output buffer independently of the signal from said output enable terminal is output, said output enable input terminal and the output of said internal voltage generating means being connected via said switch means.

5. The semiconductor integrated circuit device according to claim 1, wherein said semiconductor integrated circuit device includes a dynamic RAM, and said test mode designating signal generating means includes an internal timing generation circuit for generating said test mode designating signal in accordance with a signal input as a pseudo address input signal and applying said test mode designating signal to each switch means in a test mode.

6. A semiconductor integrated circuit device operating with an externally applied power supply voltage, comprising:

internal voltage generating means for converting said external power supply voltage to a predetermined internal power supply voltage;

an external terminal for externally applying an arbitrary voltage to said semiconductor integrated circuit device;

means for generating a signal for designating a test mode;

means for stopping an operation of said internal voltage generating means in said test mode; and switch means including a p channel MOS transistor and an n channel MOS transistor connected in series, provided between an output of said internal voltage generating means and said external terminal, and simultaneously opening and closing in response to said test mode designating signal.

7. The semiconductor integrated circuit device according to claim 6, wherein a potential of said predetermined internal power supply voltage generated by said internal voltage generating means has an opposite polarity to a polarity of the external power supply potential, and the p channel MOS transistor has its gate biased to said potential of opposite polarity with said switch means being rendered conductive.

8. The semiconductor integrated circuit device according to claim 6, wherein said semiconductor integrated circuit device includes a dynamic RAM, and said external terminal is employed for other signal inputs and outputs in a normal operation.

9. The semiconductor integrated circuit device according to claim 8, wherein said external terminal includes an output enable terminal for applying a driving signal to a data output buffer, further including a two-input logic circuit having a first input for receiving a signal from said output enable terminal, a second input for receiving said test mode designating signal and an output for applying a driving signal to the data output buffer, and switching in response to said test mode signal between a first state where a signal from said output enable terminal is output as it is and a second state where a signal for driving the data output buffer independently of the signal from said output enable terminal is output, said output enable input terminal and the output of said internal voltage generating means being connected via said switch means.

10. The semiconductor integrated circuit device according to claim 6, wherein said semiconductor integrated circuit device includes a dynamic RAM, said test mode designating signal generating means including an internal timing generation circuit for generating said test mode designating signal in accordance with a signal input as a pseudo address input signal and applying the generated signal to each switch means or internal voltage generating means in a test mode.

* * * * *